United States Patent [19]

Gollinger et al.

[11] Patent Number: 4,489,342

[45] Date of Patent: Dec. 18, 1984

[54] MOSFET INTEGRATED DELAY CIRCUIT FOR DIGITAL SIGNALS AND ITS USE IN COLOR-TELEVISON RECEIVERS

[75] Inventors: Wolfgang Gollinger, Gundelfingen; Hermannus Schat, Freiburg; Dieter Holzmann, Freiburg-Munzingen; Herbert Elmis, Denzlingen; Holger Struthoff; Detlev Kunz, both of Freiburg, all of Fed. Rep. of Germany

[73] Assignee: ITT Industries, Inc., New York, N.Y.

[21] Appl. No.: 349,228

[22] Filed: Feb. 16, 1982

[51] Int. Cl.³ .............................................. H04N 5/93
[52] U.S. Cl. ...................................... 358/17; 358/18; 307/605
[58] Field of Search ............... 358/17, 18, 139, 181; 307/594, 595, 596, 605, 248, 571

[56] References Cited

U.S. PATENT DOCUMENTS

| | | | |
|---|---|---|---|
| 4,178,607 | 12/1979 | Mikado | 358/17 |
| 4,268,852 | 5/1981 | Nakamura | 358/17 |
| 4,268,853 | 5/1981 | Nakamura | 358/17 |

*Primary Examiner*—Tommy P. Chin
*Attorney, Agent, or Firm*—Donald J. Lenkszus

[57] ABSTRACT

To adjust time delays in equidistant steps, an inverter chain is provided with an even number of static inverters of identical topology. The output of one of the even-numbered inverters is connected to the signal output via a selector switch. During suitable frequency-measuring periods, an odd number of inverters is connected to form a ring by directly coupling the output of an odd-numbered inverter to the input of the first, and a digital measuring arrangement determines the time delay of the ring-connected portion from the frequency of the ring's self-excited oscillation. The output signal of the measuring arrangement is used to adjust the time delay of the inverter chain.

19 Claims, 3 Drawing Figures

MOSFET INTEGRATED DELAY CIRCUIT FOR DIGITAL SIGNALS AND ITS USE IN COLOR-TELEVISON RECEIVERS

BACKGROUND OF THE INVENTION

1. Field of the Invention

The present invention relates to metal-oxide semiconductor field-effect transistor integrated delay circuits for digital signals and, more particularly to such circuits wherein time delays adjustable in equidistant steps can be produced using an inverter chain consisting of inverters connected in series with respect to the signal flow.

2. Description of the Prior Art

From DE-OS No. 29 28 224 it is known that delay arrangements can be constructed from inverters connected in series with respect to the signal flow, and such arrangements can be used as delay circuits for ring oscillators as are described in DE-OS-No. 29 28 430, for example. The prior art inverter chain consists of alternate series connections of simple static inverters, formed from a switching transistor and a load transistor, and inverters expanded by a pull-up transistor and a bootstrap capacitor. The time delay provided by the prior art arrangement depends on the number of inverters connected in series.

If adjustable time delays are to be obtainable with an inverter chain of this kind as is the case in the present invention, the inverters must be provided with signal output terminals to be selected by means of a selector switch. The time delay is then dependent on the position of the selected output terminal.

SUMMARY OF THE INVENTION

The present invention solves the overall problem of obtaining time delays adjustable in equidistant steps by means of an inverter chain. In the first step of the solution, the invention departs from the above-mentioned arrangement in that it uses exclusively static inverters within the inverter chain in an even number, with the outputs of the even-numbered inverters connected to the above-mentioned selector switch. The smallest adjustable time delay thus corresponds to the delay provided by one inverter pair.

In the mass production of such integrated delay circuits, however, manufacturing variations occur which result in an unacceptable spread of the time delay from one integrated circuit to another. It is an object of the invention to remedy this, i.e., to permit the manufacture of integrated delay circuits which provide equal, reproducible time delays despite manufacturing variations.

To accomplish this, during suitable rest periods used as frequency-measuring periods, an odd number of inverters is connected to form a ring by directly coupling the output of the last odd-numbered inverter to the input of the first, and a digital measuring arrangement determines the time delay of the ring-connected portion of the inverter chain from the frequency of the ring's self-excited oscillation. This measurement result either controls the time delay of the inverter pairs via the gate voltages of the load transistors or changes the setting of the selector switch at a fixed gate voltage.

The advantages gained by the invention can already be seen in the solution of the problem, because mass-reproducible time delays are obtainable with inverter chains only by the above-mentioned measurement and control or adjustment. In addition, the exclusive use of static inverters results in a considerable simplification of the semiconductor crystal topology as compared to the prior art mentioned above.

BRIEF DESCRIPTION OF THE DRAWINGS

The above-mentioned and other features and objects of this invention will become more apparent by reference to the following description taken in conjunction with the accompanying drawings, in which.

DESCRIPTION OF THE INVENTION

Figure 1:
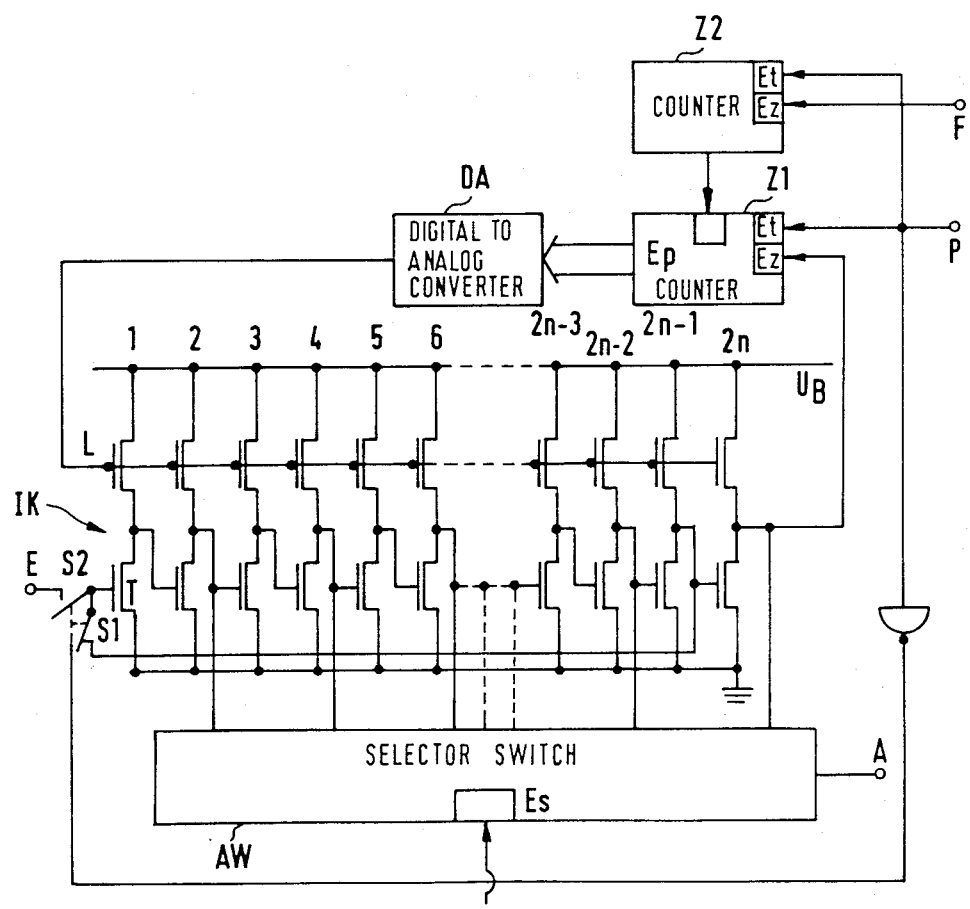
FIG. 1 shows an embodiment of the first variant of the invention, partly in a block diagram.

In FIG. 1, the inverter chain IK consists of 2n static inverters each constructed from a switching transistor T, having one end of its controlled current path grounded, and a load transistor L, whose controlled current path is connected in series with that of the switching transistor T and has its other end connected to the supply voltage $U_B$. Of the 2n inverters, the inverters 1, 2, 3, 4, 5, 6, 2n-3, 2n-2, 2n-1, and 2n are shown. The gate of the switching transistor T of the first inverter 1 can be connected via the first electronic switch S1 to the output of an odd-numbered inverter; in FIG. 1, this is the next to the last inverter 2n-1. The gate of the switching transistor T of the first inverter 1 is also connected to the input E via the second electronic switch S2. The individual inverters are connected in series with respect to the signal flow as the output of a preceding inverter, i.e., the node of a switching transistor T and a load transistor L, is connected to the gate of the next switching transistor of the chain.

The outputs of the even-numbered inverters 2, 4, 6, 2n-2, 2n are connected to the inputs of the 1-out-of-n selector switch AW, via whose control input Es the respective inverter output terminals can be selected, so that any number from the set n of series-connected inverter pairs may be connected between the input E and the output A. The adjustability of the selector switch AW, which is an electronic selector switch, of course, is indicated by the arrow at the control input Es.

To compensate for manufacturing variations affecting the time delay, in accordance with the invention, during frequency-measuring periods $t_m$, an odd number of inverters is connected to form a ring by directly coupling the output of an odd-numbered inverter and preferably the last odd-numbered inverter to the input of the first, and the resulting self-excited oscillation, whose frequency depends on the actual inverter delay, is measured. To this end, during the frequency-measuring periods $t_m$, the first electronic switch S1 is closed and the second electronic switch S2 is open, so that the input E is separated from the gate of the switching transistor T of the first inverter 1. These positions of the two electronic switches S1, S2 are shown in FIG. 1.

While it is preferred to connect the output of an odd-numbered inverter to the input of the first inverter, an output of an even-numbered inverter can also be connected to the input of the first inverter if it is done through an additional inverter.

The pulses of the self-excited oscillation of the ring-connected inverter chain are counted by the first counter Z1, for which purpose the output of the inverter chain IK, i.e., the output of the last inverter 2n, is coupled to the count input Ez of the counter Z1. The start input Et of the counter Z1 is presented with the signal P, which determines the frequency-measuring periods $t_m$, so that the counter is started on the leading edge of each measuring-period pulse.

This signal P is also applied to the start input Et of the second counter Z2, whose count input Ez is fed with the clock signal F, which, if the delay circuit is used in color-television receivers, may advantageously have four times the chrominance-subcarrier frequency; in that case, the frequency-measuring periods $t_m$ fall within the retrace intervals. The second counter Z2 now counts up to a predetermined upper count whose output is connected to the stop input Ep of the first counter Z1. Thus, the number of clock-signal pulses counted by the second counter Z2 until the aforementioned count is reached determines the measuring period $t_m$. The count reached in the first counter Z1 by that time, i.e., the digital signal corresponding to this count, is converted by the digital-to-analog converter DA to a DC voltage which is applied to the gates of the load transistors L of the 2n inverters. This voltage influences the inverter delay.

Figure 2:
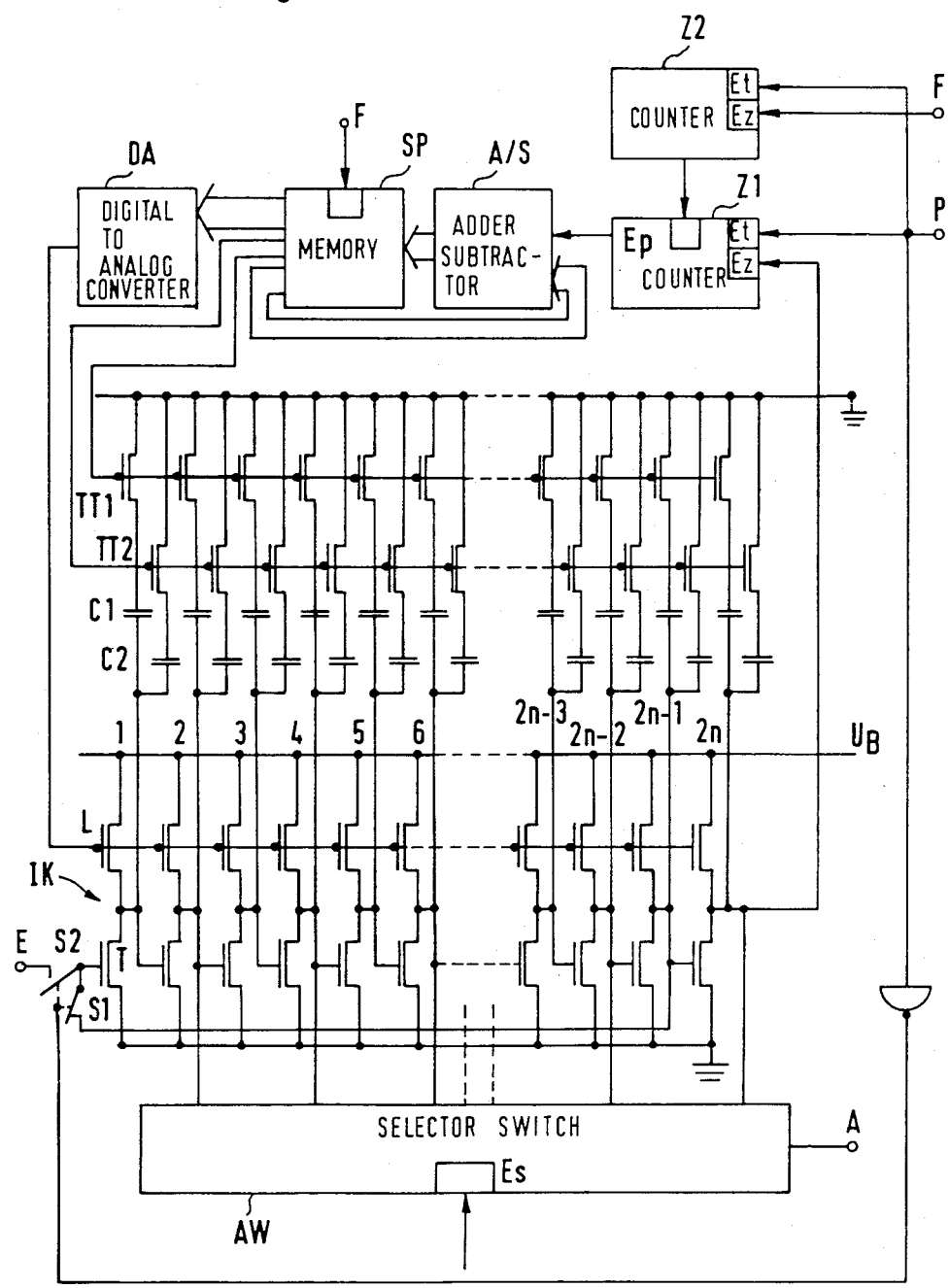
FIG. 2 shows a development of the embodiment of FIG. 1, partly in a block diagram.

FIG. 2 shows a development of the embodiment of FIG. 1 which permits a greater range of adjustment of the inverter delay. To this end, capacitors C1, C2 can be connected to the output of each inverter via transfer transistors TT1, TT2, whereby adjustment in coarse steps is possible in addition to the adjustment by means of the variable gate voltages of the load transistors L.

The capacitors C1 and C2 are connected in series with the controlled current paths of the associated transfer transistors TT1 and TT2, respectively, which have one end connected to ground and whose gates are controlled in common by the output for the two most significant bits of the digital signal stored in the memory SP, while the remaining bits of this digital signal are applied to the input of the digital-to-analog converter DA, which controls the gates of the load transistors L.

In the embodiment of FIG. 2, the counts of the first counter Z1, which, together with the second counter Z2, is controlled in the same manner as in FIG. 1, are processed into an output signal which assumes one or the other of two binary states above or below a set count, respectively; in other words, a digital threshold value is formed with the first counter Z1. The binary signal corresponding to this threshold value switches the adder-subtracter A/S between add and subtract, so that the latter either adds one unit to the signal applied to it from the memory SP or subtracts one unit therefrom. This signal, which is changed in steps dependent on the count of the first counter Z1, is written into the memory SP under control of the clock signal F and transferred to the output at the end of each clock pulse. As mentioned earlier, the most significant bits are used to drive the transfer transistors TT1, TT2, while the remaining bits are fed to the digital-to-analog converter DA.

Coarse adjustment may also be provided by replacing the capacitors C1, C2 with load transistors having a topology different from that of the load transistors L. It is also possible to provide only one or more than two capacitors if required.

Figure 3:
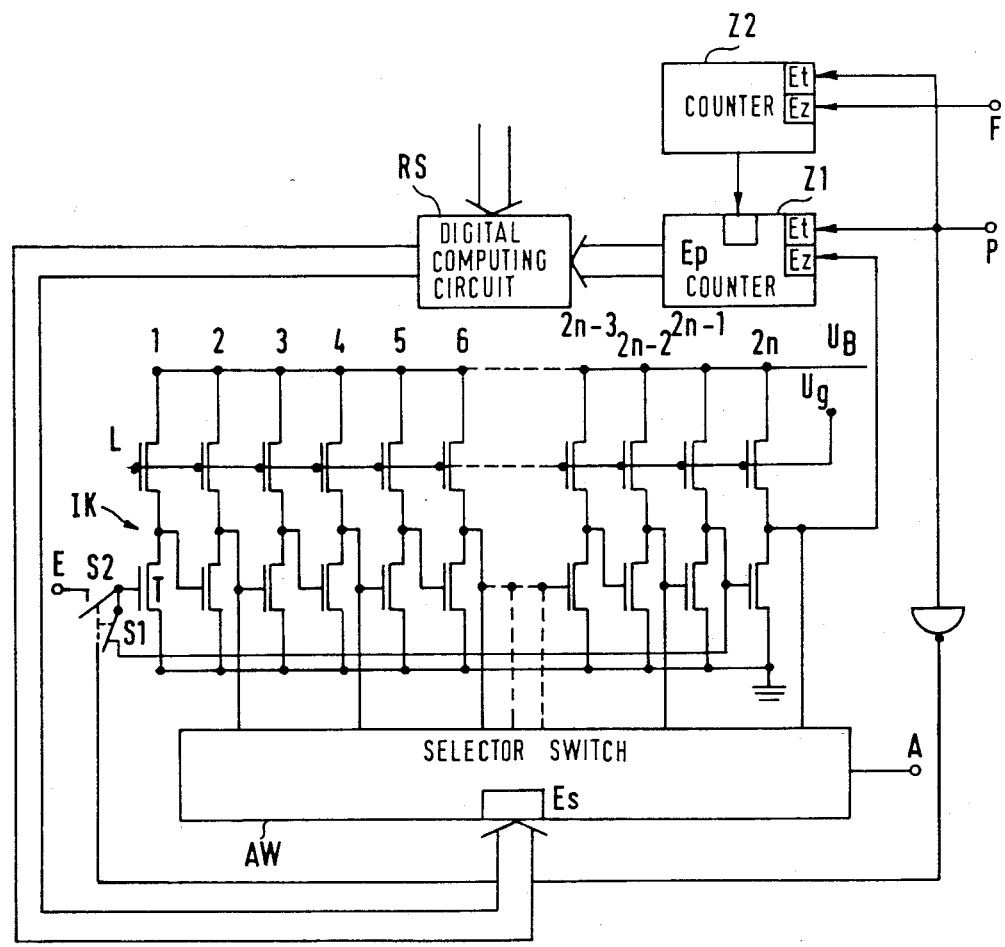
FIG. 3 shows an embodiment of the second variant of the invention, partly in block diagram.

FIG. 3 shows an embodiment of the second variant of the invention. The digital-to-analog converter of FIGS. 1 and 2 has been replaced by a digital computing circuit RS which is fed with the count of the first counter Z1 and the set digital value of the total time delay; this is indicated by the stripe-like arrow. The digital output signal of the computing circuit RS acts on the selector switch AW via the control input Es, so that different inverter output terminals will be connected to the output A for different inverter delays. The gates of the load transistors L are connected to the fixed gate voltage Ug or to the output nodes of the respective inverters.

The embodiment of FIG. 3 is particularly advantageous if the quotient of the number of ring-connected inverters and the number of clock-signal periods counted by the second counter Z2 is equal to a positive or negative power of two, and if the number of positions of the selector switch AW is also a power of two, because the digital computing circuit RS can then be designed as a multiplier. In that case, it is also advantageous to design the two counters Z1, Z2 as binary counters, with the capacity of the second counter Z2 then being equal to half the number n of inverters.

For the above-mentioned preferred use of the invention in color-television receivers, time delays of about 70 ns can be adjusted in equidistant 5-ns steps with a 64-stage inverter chain, for example.

What is claimed is:

1. An integrated delay circuit for digital signals, in which the time delay is adjustable in equidistant steps comprising:
   an input terminal receiving said digital signals;
   an inverter chain including a plurality of static inverters connected in series, each static inverter having an input and an output and delaying the transmission of a signal from said input to said output by a delay time, the input of the first one of said plurality of inverters being coupleable to said input terminal;
   selector means having a plurality of inputs, each of said plurality of inputs being coupled to the output of a predetermined one of said plurality of inverters, and an output, said selector means selectively connecting one of said plurality of inputs to said output;
   first means for coupling the output of a predetermined one of said plurality of inverters to the input of said first inverter during a measuring interval to form an inverter ring having an odd number of inverters such that self-excited oscillation occurs in said inverter ring to provide an output signal;
   second means responsive to said output signal for determining the time delay of said inverter ring from the frequency of said self-excited oscillation; and
   third means coupled to said inverter chain and responsive to said second means for changing the time delay between said input terminal and said selector means output.

2. An integrated delay circuit in accordance with claim 1, wherein each inverter of said plurality of inverters comprises:
   a switching transistor and a load transistor of the metal-oxide semiconductor field-effect type; and
   each inverter of said plurality of inverters is of identical topology.

3. An integrated delay circuit in accordance with claim 2, wherein said second means is coupled to the gate elements of each of said load transistors to vary the delay of each one of said plurality of inverters.

4. An integrated delay circuit in accordance with claim 2, wherein each said load transistor of each of said plurality of inverters is provided with a fixed gate voltage.

5. An integrated delay circuit in accordance with claim 2, wherein said second means comprises: a digital measuring arrangement for determining the time delay of the inverter ring and provides a digital measuring signal corresponding thereto and said third means comprises a digital-to-analog converter for converting said digital measuring signal to an analog signal for driving the gate of each said load transistor of said plurality of inverters to thereby set the delay time of each of said plurality of inverters.

6. An integrated delay circuit in accordance with claim 1, wherein said second means comprises: a digital measuring arrangement for determining the time delay of said inverter ring and for providing said third means comprises a digital signal corresponding thereto, and a digital computing means having a first parallel input connected to said digital measuring arrangement and a second parallel input for receiving a set digital value of the total time delay of the inverter chain and for providing a parallel output to said selector means for controlling the delay time between said input terminal and said selector means output.

7. An integrated delay circuit in accordance with claim 5, wherein said second means comprises:
a first counter having an input connected to the output of a second predetermined one of said plurality of inverters and adapted to start counting at the beginning of said measuring period;
a second counter also adapted to start counting at the beginning of said measuring period for counting a clock signal of constant frequency;
said first counter having a stop input connected to an output of said second counter for stopping said first counter when said second counter reaches a predetermined count whereby said first counter provides an output corresponding to the time delay of said inverter ring.

8. An integrated delay circuit in accordance with claim 7, additionally comprising:
an adder-subtracter circuit having a control input for selecting an addition or subtraction operation, an input and an output;
a memory having an enable signal for receiving the clock signal, an input coupled to the output of the adder-subtracter circuit and an output;
transfer transistors associated with each said inverter, each transfer transistor having one end of its control path grounded and the other end connected to the input of the associated inverter via a capacitor; whereby said first counter provides an output having one or the other of two binary states above or below a set count respectively, said first counter output is applied to said control input of said adder-subtracter, at least one of the most significant bits of said memory output are connected to the gates of said transfer transistors, and the remaining bits of said memory output are provided to said third means.

9. An integrated delay circuit in accordance with claim 7, wherein: the quotient of the number of inverters in said inverter ring and the number of periods of said clock signal counted by said second counter is equal to a positive or negative power of 2, and wherein the number of said plurality of inputs of said selector means is a power of 2, and said digital computing means is a multiplier.

10. An integrated delay circuit in accordance with claim 7, wherein said first counter and said second counter are each binary counters and the count capacity of said second counter is equal to one-half the number of said plurality of inverters.

11. An integrated delay circuit in accordance with claim 7 adapted for use in a television receiver wherein: said digital signals are pulses derived from received horizontal synchronizing pulses; said measuring period occurs within a retrace interval; and said clock signal has a frequency equal to four times a chrominance-subcarrier frequency.

12. An integrated delay circuit in accordance with claim 1, wherein: said first means comprises an electronic switch for connecting the output of said predetermined one of said plurality of inverters to the input said first one of said plurality of inverters during said measuring interval; said delay circuit comprising a second electronic switch for connecting said input terminal to the input of said first one of said plurality of inverters during times other than said measuring interval.

13. An integrated delay circuit in accordance with claim 1, wherein said third means changes said time delay by adjusting said delay time of each of said plurality of inverters.

14. An integrated delay circuit in accordance with claim 1, wherein said second means is coupled to said selector means and said selector means changes said delay time in response to said second means by selecting a different one of said plurality of inputs for connection to said output.

15. An integrated delay circuit in accordance with claim 14, wherein each inverter of said plurality of inverters comprises:
a switching transistor and a load transistor of the metal-oxide semiconductor field-effect type; and
each inverter of said plurality of inverters is of identical topology.

16. An integrated delay circuit in accordance with claim 1 adapted for use in a television receiver wherein: said digital signals are pulses derived from received horizontal synchronizing pulses; and said measuring period occurs within a retrace interval.

17. A delay circuit for delaying digital signals by a time delay which is adjustable in equidistant steps, said delay circuit comprises:
an input terminal for receiving said digital signals;
a plurality of serially connected delay stages each having an input and an output;
each delay stage comprising a first and a second serially connected static inverter, said first static inverter having an input coupled to said delay stage input and an output coupled to an input of said second static inverter, said second static inverter having an output coupled to said delay stage output, each of said first and second inverters providing a delay time equal to one half of one of said equidistant steps;
first means for coupling said input terminal to the input of a first one of said delay stages when a measuring interval does not occur and for uncoupling said input terminal from said input of a first one of said delay stages during said measuring interval;
an output terminal;
second means for selectively coupling one output at a time of said plurality of delay stages to said output terminal;

third means for coupling during said measuring interval an input of a predetermined one of said plurality of delay stages to the output of one of said first inverter or of said second inverter of a second predetermined one of said plurality of delay stages to form a ring having a time delay such that self-excited oscillation occurs in said ring to provide an output signal;

fourth means coupled to said output signal for determining the time delay of said ring from the frequency of said self-excited oscillation;

fifth means coupled to said chain responsive to said fourth means for controlling the time delay of each said delay stage.

18. A delay circuit in accordance with claim 17, wherein said fourth means comprises:

a digital measuring arrangement for determining the time delay of said ring and for providing a digital measuring signal indicative of the time delay of said ring; and said fifth means comprises a digital-to-analog converter responsive to said digital measuring signal for generating an analog signal; and each said delay stage is responsive to said analog signal such that said analog signal controls the delay time of each said delay stage.

19. A delay circuit in accordance with claim 17 for use in a color television receiver wherein:

said digital signals are pulses derived from horizontal synchronizing pulses and said measuring interval falls within retrace intervals.

* * * * *

UNITED STATES PATENT OFFICE
CERTIFICATE OF CORRECTION

Patent No. 4,489,342     Dated December 18, 1985

Inventor(s) W. Gollinger et al.

It is certified that error appears in the above-identified patent and that said Letters Patent are hereby corrected as shown below:

On the cover sheet, the following priority information should appear:

[30] Foreign Application Priority Data

March 6, 1981 [EP] European Pat. Office...81 200255.8

*Signed and Sealed this*

*Twenty-fifth* Day of *June 1985*

[SEAL]

*Attest:*

DONALD J. QUIGG

*Attesting Officer*     *Acting Commissioner of Patents and Trademarks*